(12) United States Patent
Tashiro

(10) Patent No.: US 12,044,972 B2
(45) Date of Patent: Jul. 23, 2024

(54) METHOD OF MANUFACTURING FLEXOGRAPHIC PRINTING PLATE

(71) Applicant: FUJIFILM Corporation, Tokyo (JP)

(72) Inventor: Hiroshi Tashiro, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 937 days.

(21) Appl. No.: 17/032,255

(22) Filed: Sep. 25, 2020

(65) Prior Publication Data

US 2021/0011386 A1 Jan. 14, 2021

Related U.S. Application Data

(63) Continuation of application No. PCT/JP2019/009445, filed on Mar. 8, 2019.

(30) Foreign Application Priority Data

Mar. 28, 2018 (JP) .................................. 2018-062163

(51) Int. Cl.
| | | |
|---|---|---|
| *G03F 7/32* | (2006.01) | |
| *G03F 7/20* | (2006.01) | |
| *G03F 7/40* | (2006.01) | |
| G03G 9/097 | (2006.01) | |
| G03G 9/125 | (2006.01) | |

(52) U.S. Cl.
CPC ............ *G03F 7/322* (2013.01); *G03F 7/2014* (2013.01); *G03F 7/40* (2013.01); *G03G 9/0975* (2013.01); *G03G 9/09775* (2013.01); *G03G 9/125* (2013.01)

(58) Field of Classification Search
CPC ........................................................ G03F 7/32
See application file for complete search history.

(56) References Cited

U.S. PATENT DOCUMENTS

| 9,588,429 B1 | 3/2017 | Huang et al. |
|---|---|---|
| 2002/0055066 A1 | 5/2002 | Takamiya |
| 2004/0185371 A1 | 9/2004 | Takamiya |
| 2005/0175942 A1 | 8/2005 | Ohnishi |
| 2019/0101820 A1* | 4/2019 | Ali .......................... G03F 7/202 |

FOREIGN PATENT DOCUMENTS

| EP | 1 457 836 A2 | 9/2004 |
|---|---|---|
| EP | 2 381 312 A2 | 10/2011 |
| JP | 50-077037 A | 6/1975 |
| JP | 7-234523 A | 9/1995 |
| JP | H07234523 A * | 9/1995 |
| JP | 7-301920 A | 11/1995 |
| JP | H07301920 A * | 11/1995 |
| JP | 200056473 A | 2/2000 |
| JP | 2001-242639 A | 9/2001 |
| JP | 2004-045724 A | 2/2004 |
| JP | 2004-317660 A | 11/2004 |

OTHER PUBLICATIONS

Machine Translation of JP-H07234523-A (Year: 2024).*
Extended European Search Report issued Apr. 9, 2021 in European Application No. 19778244.4.
International Search Report issued May 21, 2019 in International Application No. PCT/JP2019/009445.
Written Opinion of the International Searching Authority issued May 21, 2019 in International Application No. PCT/JP2019/009445.
International Preliminary Report on Patentability issued Sep. 29, 2020 in International Application No. PCT/JP2019/009445.
Chinese Office Action dated Apr. 28, 2023 in Chinese Application No. 201980022471.3.
Communication dated Sep. 14, 2021 from the Japanese Patent Office in application No. 2020-509800.
Office Action dated Aug. 31, 2023 in Chinese Application No. 201980022471.3.

* cited by examiner

*Primary Examiner* — Chanceity N Robinson
(74) *Attorney, Agent, or Firm* — Sughrue Mion, PLLC

(57) ABSTRACT

An aqueous developer for a flexographic printing plate capable of maintaining good printing reproducibility and suppressing the adhesion and aggregation of the dispersion in the developer during repeated use, and a method of manufacturing a flexographic printing plate using the same, are provided. The aqueous developer for a flexographic printing plate is an aqueous developer for a flexographic printing plate containing a surfactant having a molecular weight of 1000 or more, and water.

7 Claims, No Drawings

METHOD OF MANUFACTURING FLEXOGRAPHIC PRINTING PLATE

CROSS-REFERENCE TO RELATED APPLICATIONS

This application is a Continuation of PCT International Application No. PCT/JP2019/009445 filed on Mar. 8, 2019, which claims priority under 35 U.S.C. § 119(a) to Japanese Patent Application No. 2018-062163 filed on Mar. 28, 2018. The above application is hereby expressly incorporated by reference, in its entirety, into the present application.

BACKGROUND OF THE INVENTION

1. Field of the Invention

The present invention relates to an aqueous developer for a flexographic printing plate and a method of manufacturing a flexographic printing plate using the same.

2. Description of the Related Art

In recent years, various industries have started to reduce the use of organic solvents from the viewpoint of improving the working environment and preserving the global environment, and in a plate making step of a photosensitive flexographic printing plate used for printing, the use of an aqueous developable photosensitive resin plate is increasing.

For example, JP1995-234523A (JP-H07-234523A) discloses "a method of developing a photosensitive resin plate including removing an unexposed portion using a developer after exposing the photosensitive resin plate, in which the developer is a developer in which a hydrocarbon compound having 11 or less carbon atoms, which has a $SO_3M$ group (M represents any one of a monovalent metal atom, a divalent metal atom, a trivalent metal atom, or an ammonium compound), is contained in water" ([claim 1]).

In addition, JP2004-317660A discloses "an aqueous developer composition for a photosensitive resin consisting of at least a surfactant (A), a pH adjuster (B), a cleaning accelerator (C), and water, in which the surfactant (A) includes an alkylene oxide adduct of a primary alcohol having at least HLB 12 to 16 and having 6 to 8 carbon atoms, the pH adjuster (B) is an inorganic salt, the pH of the aqueous developer is 8 to 13, and the cleaning accelerator (C) includes a compound represented by Formula (I) or (II),

  (I)

  (II)

in Formula (I), R and R1 represent an alkyl or alkenyl group having 2 to 6 carbon atoms, A represents an alkylene group having 2 to 4 carbon atoms, and n represents a number of 1 to 5, and in Formula (II), n is 6 to 20" ([claim 1]).

The present inventors have conducted an investigation on the aqueous developers described in JP1995-234523A (JP-H07-234523A) and JP2004-317660A and thus have found that image reproducibility is good. However, it has been clarified that after using this aqueous developer for several times of development, in a case of washing (rinsing) the developer remaining on the printing plate or on the wall surface of a bath of a developing device with water, there is a problem that a dispersion in the developer may be attached to the printing plate or the like to cause contamination on a material to be printed or the dispersion in the developer may be aggregated and affect the maintainability of a printing device.

An object of the present invention is to provide an aqueous developer for a flexographic printing plate capable of maintaining good printing reproducibility and suppressing adhesion and aggregation of a dispersion in a developer during repeated use, and a method of manufacturing a flexographic printing plate using the same.

As a result of conducting intensive investigations to achieve the above object, the present inventors have found that an aqueous developer in which a surfactant having a predetermined molecular weight is formulated is capable of maintaining good printing reproducibility and suppressing the adhesion and aggregation of the dispersion in the developer during repeated use, and thus completed the present invention.

That is, the present inventors have found that the above object can be achieved by adopting the following configurations.

[1] An aqueous developer for a flexographic printing plate comprising: a surfactant having a molecular weight of 1000 or more; and water.

[2] The aqueous developer for a flexographic printing plate according to [1], in which a content of the surfactant is 0.005% to 5% by mass.

[3] The aqueous developer for a flexographic printing plate according to [1] or [2], in which the surfactant is a polymer having a repeating unit represented by any one of Formulae (1) to (6),

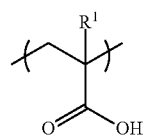  (1)

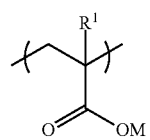  (2)

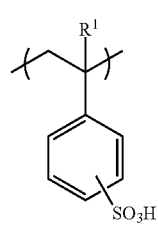  (3)

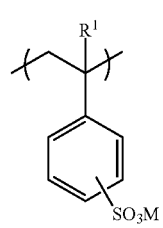  (4)

-continued

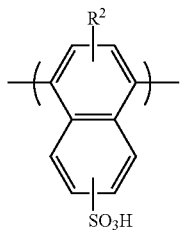
(5)

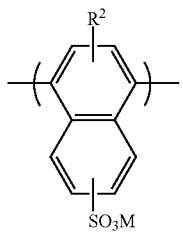
(6)

in Formulae (1) to (4), $R^1$ represents a hydrogen atom or a methyl group, in Formulae (5) and (6), $R^2$ represents any one of a hydrogen atom, a methyl group, or an ethyl group, and in Formulae (2), (4) and (6), M represents any one of sodium, potassium or calcium.

[4] The aqueous developer for a flexographic printing plate according to [1] or [2], in which the surfactant is a polymer represented by Formula (7),

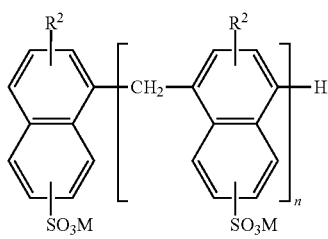
(7)

in Formula (7), $R^2$ represents any one of a hydrogen atom, a methyl group, or an ethyl group, and M represents any one of sodium, potassium, or calcium.

[5] The aqueous developer for a flexographic printing plate according to any one of [1] to [4], in which the surfactant is an anionic surfactant.

[6] The aqueous developer for a flexographic printing plate according to any one of [1] to [5], further comprising: at least one of an alkali metal carbonate or an alkali metal hydroxide.

[7] A method of manufacturing a flexographic printing plate having a non-image area and an image area, the method comprising:
an exposure step of imagewise exposing a photosensitive layer in a flexographic printing plate precursor having the photosensitive layer;
a development step of performing development using the aqueous developer for a flexographic printing plate according to any one of [1] to [6] after the exposure step to form a non-image area and an image area; and
a rinsing step of rinsing the non-image area and the image area with water after the development step.

According to the present invention, it is possible to provide an aqueous developer for a flexographic printing plate capable of maintaining good printing reproducibility and suppressing the adhesion and aggregation of the dispersion in the developer during repeated use, and a method of manufacturing a flexographic printing plate using the same.

DESCRIPTION OF THE PREFERRED EMBODIMENTS

Hereinafter, the present invention will be described in detail.

The description of the components described below may be made based on typical embodiments of the present invention, but the present invention is not limited to such embodiments.

In the specification, the numerical range expressed by using "to" means a range including the numerical values before and after "to" as the lower limit value and the upper limit value.

[Aqueous Developer for Flexographic Printing Plate]

An aqueous developer for a flexographic printing plate according to an embodiment of the present invention (hereinafter, also abbreviated as "aqueous developer of the present invention") is an aqueous developer for a flexographic printing plate containing a surfactant having a molecular weight of 1000 or more, and water.

In the present invention, as described above, the aqueous developer containing a surfactant having a molecular weight of 1000 or more is capable of maintaining good printing reproducibility and suppressing the adhesion and aggregation of a dispersion in the developer during repeated use.

Although the details thereof are not clear, the present inventors have assumed as follows.

First, the aqueous developer is usually used repeatedly for two or more times of development, but for example, in the developer used for the second development, the plate material removed from the flexographic printing plate precursor by the first development, that is, the plate material in an unexposed portion (uncured portion) is present as a dispersion.

Then, as shown in Comparative Examples described later, in a case where a surfactant having a molecular weight of less than 1000 is formulated in the aqueous developer, it is found that the adhesion of the dispersion increases in a case where the aqueous developer is diluted with water in the assumption of a rinsing step.

Therefore, in the present invention, it is considered that this is because by formulating a surfactant having a molecular weight of 1000 or more, the association between the surfactant and the dispersant becomes strong, and the association state can be maintained even in a case where the aqueous developer is diluted with water in the assumption of the rinsing step.

Hereinafter, each component contained in the aqueous developer according to the embodiment of the present invention will be described in detail.

(Surfactant)

The surfactant contained in the aqueous developer according to the embodiment of the present invention is a surfactant having a molecular weight of 1000 or more.

Here, the molecular weight is a weight-average molecular weight measured by a gel permeation chromatography (GPC) method under the following conditions.

[Eluent] tetrahydrofuran (THF)

[Device name] Ecosec HLC-8220GPC (manufactured by Tosoh Corporation)

[Column] TSKgel SuperHZM-H, TSKgel SuperHZ4000, and TSKgel SuperHZM200 (manufactured by Tosoh Corporation)

[Column temperature] 40° C.

[Flow rate] 50 ml/min

The surfactant has a molecular weight of preferably 1000 to 500000, and more preferably 1500 to 50000.

In the present invention, from the viewpoint of maintaining the dispersibility of the dispersion, the surfactant is preferably a polymer having a repeating unit represented by any of Formulae (1) to (6), and among these, the surfactant is more preferably a polymer having a repeating unit represented by Formula (1) (polycarboxylic acid) or a polymer having a repeating unit represented by Formula (2) (polycarboxylic acid metal salt), and the surfactant is even more preferably a polymer having a repeating unit represented by Formula (2).

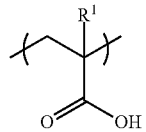
(1)

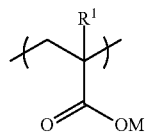
(2)

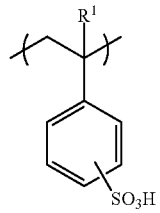
(3)

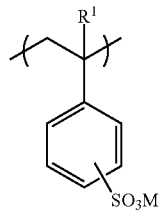
(4)

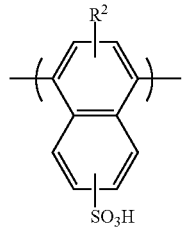
(5)

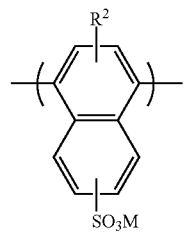
(6)

In Formulae (1) to (4), $R^1$ represents a hydrogen atom or a methyl group.

In Formulae (5) and (6), $R^2$ represents any one of a hydrogen atom, a methyl group, or an ethyl group, and preferably represents a hydrogen atom.

Further, in Formulae (2), (4) and (6), M represents any one of sodium, potassium, or calcium, and preferably represents sodium.

In the present invention, from the viewpoint of adsorbability to the dispersion and maintaining the dispersibility of the dispersion, the surfactant is preferably a polymer represented by Formula (7), that is, a metal salt of β-naphthalenesulfonic acid formalin condensation.

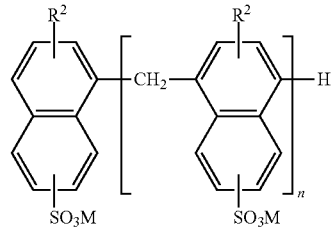
(7)

In Formula (7), $R^2$ represents any one of a hydrogen atom, a methyl group, or an ethyl group, and is preferably a hydrogen atom.

Further, in Formula (7), M represents any of sodium, potassium, or calcium, and is preferably sodium.

In the present invention, the surfactant is preferably an anionic surfactant from the viewpoint of hydrophilic stability in the developer.

In addition, in the present invention, the content of the surfactant is preferably 0.005% to 5% by mass, more preferably 0.01% to 1% by mass, and even more preferably more than 0.01% by mass and less than 0.5% by mass with respect to the total mass of the aqueous developer.

[Water]

The water contained in the aqueous developer according to the embodiment of the present invention is not particularly limited, and any of purified water, distilled water, ion exchange water, pure water, ultrapure water such as Milli-Q water can be used. The Milli-Q water is ultrapure water obtained by a Milli-Q water production device, which is an ultrapure water production device manufactured by Merck KGaA.

The content of water contained in the aqueous developer according to the embodiment of the present invention is preferably 80% to 99.99% by mass, and more preferably 90% to 99.9% by mass with respect to the total mass of the developer.

[Alkali Metal Carbonate/Alkali Metal Hydroxide]

The aqueous developer according to the embodiment of the present invention preferably contains at least one of an alkali metal carbonate or an alkali metal hydroxide and more preferably contains at least an alkali metal carbonate for the reason that the adhesion of the dispersion can be further suppressed.

Here, specific examples of the alkali metal include sodium, potassium, and calcium.

Specific examples of the alkali metal carbonate include sodium carbonate, potassium carbonate and the like, and among these, sodium carbonate is preferable from the viewpoint of safety.

Specific examples of the alkali metal hydroxide include sodium hydroxide and potassium hydroxide.

The content of the alkali metal carbonate and/or the alkali metal hydroxide (the total content in a case where both are contained) is preferably 0.01% to 5% by mass and more preferably 0.1% to 1% by mass with respect to the total mass of the aqueous developer.

[Other Components]

In the aqueous developer according to the embodiment of the present invention, various additives may be formulated as optional components, as required.

Examples of the additives include sequestering agents such as citric acid and ethylenediaminetetraacetic acid (EDTA); alkanolamines such as ethanolamine; preservatives such as benzotriazole and benzoic acid; freezing point depressants such as glycols (for example, ethylene glycol) and lower alcohols (for example, ethanol); and antifoaming agents such as silicones and polyols, and these can be appropriately formulated within a range that does not impair the effects of the present invention.

[Development Method]

As a development method using the aqueous developer according to the embodiment of the present invention, the same method as a developing method using a conventionally known aqueous developer may be used, and examples thereof include a method of bringing an aqueous developer into contact with an unexposed portion of a flexographic printing plate precursor, applying a physical action of a brush, water pressure, supersonic waves, or the like, and dispersing a photosensitive layer (photosensitive resin composition) that constitutes the unexposed portion in water to remove the photosensitive layer.

At this time, the unexposed portion may be immersed in the aqueous developer or the aqueous developer may be continuously supplied and brought into contact with the unexposed portion in a case where a physical action is exerted.

The liquid temperature of the aqueous developer at the time of development is preferably 20° C. to 60° C., and more preferably 30° C. to 50° C.

A brush is used for the physical action force usually used, and the material, thickness, length of hair, denseness of hair, arrangement, movement of brush, rotation direction, and the like are appropriately selected.

[Flexographic Printing Plate Precursor]

For the photosensitive layer (photosensitive resin composition) of the flexographic printing plate precursor developed with the aqueous developer according to the embodiment of the present invention, a conventionally known photosensitive resin composition can be used. Examples thereof include a water-dispersible latex, rubber, a photopolymerizable monomer, a photopolymerization initiator, and a surfactant.

<Water-Dispersible Latex>

The water-dispersible latex contained in the resin composition is not particularly limited, and water-dispersible latexes used in conventionally known flexographic printing plates can be used.

Specific examples of the water-dispersible latexes include water-dispersible latex polymers such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex, and acrylate polymer latex; and polymers obtained by copolymerizing another component, such as acrylic acid and methacrylic acid, therewith. These may be used alone or in combination of two or more.

<Rubber>

The rubber contained in the resin composition is not particularly limited, and rubber materials used in conventionally known flexographic printing plates can be used.

Specific examples of the rubbers include butadiene rubber (BR), nitrile rubber (NBR), acrylic rubber, epichlorohydrin rubber, urethane rubber, isoprene rubber, styrene isoprene rubber, styrene butadiene rubber, ethylene-propylene copolymer, and chlorinated polyethylene. These may be used alone or in combination of two or more.

<Photopolymerizable Monomer>

The photopolymerizable monomer contained in the resin composition is not particularly limited, and photopolymerizable monomers used in conventionally known flexographic printing plates can be used.

Examples of the photopolymerizable monomers include ethylenically unsaturated compounds.

Specific examples of the ethylenically unsaturated compounds include (meth)acrylic monomers, (meth)acrylic oligomers, and (meth)acrylic modified polymers.

Specific examples of the (meth)acrylic modified polymers include (meth)acrylic modified butadiene rubber and (meth)acrylic modified nitrile rubber.

In addition, the term "(meth)acryl" means acryl or methacryl.

<Photopolymerization Initiator>

The photopolymerization initiator contained in the resin composition is not particularly limited as long as the photopolymerization of the above-described photopolymerizable monomer is initiated, and examples thereof include photopolymerization initiators such as alkylphenones, acetophenones, benzoin ethers, benzophenones, thioxanthones, anthraquinones, benzyls, and biacetyls.

Specific examples include benzyl dimethyl ketal, 2-hydroxy-2-methyl-1-phenyl-propane-1-one, methyl-o-benzoylbenzoate, and 1-hydroxycyclohexyl phenyl ketone.

<Surfactant>

The resin composition preferably contains a surfactant from the viewpoint of improving water developability.

Examples of the surfactant include a cationic surfactant, an anionic surfactant, and a nonionic surfactant. Among these, an anionic surfactant is preferable.

Specific examples of the anionic surfactant include aliphatic carboxylates such as sodium laurate, and sodium oleate;

higher alcohol sulfate ester salts such as sodium lauryl sulfate, sodium cetyl sulfate, and sodium oleyl sulfate;

polyoxyethylene alkyl ether sulfate ester salts such as sodium polyoxyethylene lauryl ether sulfate;

polyoxyethylene alkyl allyl ether sulfate ester salts such as sodium polyoxyethylene octyl phenyl ether sulfate, and sodium polyoxyethylene nonyl phenyl ether sulfate;

alkyl sulfonates such as sodium dodecyl sulfonate, and sodium dialkyl sulfosuccinate;

alkyl allyl sulfonates such as alkyl disulfonate, sodium dodecyl benzene sulfonate, sodium dibutyl naphthalene sulfonate, and sodium triisopropyl naphthalene sulfonate;

higher alcohol phosphate ester salts such as disodium lauryl phosphate monoester, and sodium lauryl phosphate diester; and polyoxyethylene alkyl ether phosphate ester salts such as disodium polyoxyethylene lauryl ether phosphate monoester, and sodium polyoxyethylene lauryl ether phosphate diester. These may be used alone or in combination of two or more.

[Method of Manufacturing Flexographic Printing Plate]

A method of manufacturing a flexographic printing plate according to an embodiment of the present invention includes an exposure step of imagewise exposing a photosensitive layer in a flexographic printing plate precursor having the photosensitive layer, a development step of performing development using the aqueous developer for a flexographic printing plate after the exposure step to form a non-image area and an image area, and a rinsing step of rinsing the non-image area and the image area with water after the development step.

(Exposure Step)

The exposure step is a step of irradiating the photosensitive layer with an actinic ray imagewise to induce cross-linking and/or polymerization of the region irradiated with the actinic ray and to cure the region.

The exposure step can be performed by exposing the photosensitive layer through a mask provided on the outer surface side of the photosensitive layer.

In addition, it is also preferable to perform the exposure using a vacuum frame exposure device, and in this case, after the air between the relief forming layer and the mask is exhausted, the exposure with an actinic ray is performed.

Further, the exposure may be performed in a state where the oxygen concentration is lowered, or may be performed in the atmosphere. Although not particularly limited, from the viewpoint of preventing polymerization inhibition by oxygen, it is preferable that exposure is performed at a low oxygen concentration.

(Development Step)

The development step is a step of performing developing using the above-described aqueous developer according to the embodiment of the present invention to form a non-image area and an image area, and the details are as described in the above-mentioned development method of the aqueous developer according to the embodiment of the present invention.

[Rinsing Step]

The rinsing step is a step of rinsing the surfaces of the non-image area and the image area formed in the development step with water.

In the present invention, since the developer remaining on the surfaces of the non-image area and the image area is the above-described aqueous developer according to the embodiment of the present invention, even in a case where the aqueous developer is diluted with water used in the rinsing step, the adhesion and aggregation of the dispersion in the developer can be suppressed.

As the rinsing method in the rinsing step, a method of washing with tap water, a method of spraying high pressure water, a method of rubbing the surfaces of the non-image area and the image area using a batch type or transport type brush washing machine known as a developing machine for flexographic printing plates mainly in the presence of water, and the like may be used.

EXAMPLES

Hereinafter, the present invention will be described in more detail with reference to examples. Materials, amounts used, ratios, treatment contents, treatment procedures, and the like shown in the following examples can be appropriately changed without departing from the spirit of the present invention. Therefore, the scope of the present invention should not be construed as being limited by the following examples.

Examples 1 to 9 and Comparative Examples 1 to 3

Each surfactant, an alkali metal carbonate, and water shown in Table 1 below were formulated so as to have the ratio (% by mass) shown in Table 1 below to prepare aqueous developers.

[Evaluation]
<Adhesion and Aggregating Properties>
(Preparation of Treatment Developer)

A commercially available flexographic printing plate precursor [FW-L, manufactured by Fujifilm Corporation] was exposed (back exposure) from the substrate side for 30 seconds using an exposure device having fifteen 20 W chemical lamps arranged side by side at a distance of 15 cm apart from the lamps.

Then, development was performed for 5 minutes with a brush type washing machine (liquid temperature: 50° C.) containing each of the prepared aqueous developers.

The development was continued with a new flexographic printing plate precursor until the solid content in each aqueous developer became 5% to prepare an aqueous developer for evaluation.

(Adhesion of Dispersion)

Into a 1000 cc poly container containing 450 cc of water in advance, 50 cc of the aqueous developer for evaluation was poured, and was left to stand for 24 hours after stirring. Then, the adhesion of the dispersion attached to the inner wall of the poly container was visually observed and evaluated according to the standards. The results are shown in Table 1 below.

A: There is no attached matter.
B: There is a slight amount of attached matter.
C: There is a small amount of attached matter.
D: There is a large amount of attached matter.

(Aggregating Properties of Dispersion)

In a 1000 cc plastic container containing 450 cc of water in advance, 50 cc of the aqueous developing solution for evaluation was poured and was left to stand for 12 hours after stirring. Then, the aggregates in the solution were visually observed and evaluated according to the following standards. The results are shown in Table 1 below.

A: There no large aggregates that can be visually identified.
B: A slight amount of large aggregates that can be visually identified are generated.
C: A small amount of large aggregates that can be visually identified are generated.

D: A large amount of large aggregates that can be visually identified are generated.

<Image Reproducibility>
(Preparation of Flexographic Printing Plate)

A commercially available flexographic printing plate precursor [FW-L, manufactured by Fujifilm Corporation] was exposed (back exposure) from the substrate side for 30 seconds using an exposure device having fifteen 20 W chemical lamps arranged side by side at a distance of 15 cm apart from the lamps.

Then, the protective film was peeled off, a pattern [halftone dot: 175 lpi 2%, independent dot: 150 μm diameter] was formed on an infrared ablation layer with an infrared laser, and exposure (main exposure) was performed for 10 minutes using the above exposure device at a distance of 15 cm.

Then, development was performed for 5 minutes with a brush type washing machine (liquid temperature: 50° C.) containing each of the prepared aqueous developers.

Then, the developer was dried with hot air at 60° C. until water was removed.

Then, the flexographic printing plate having an image area (dots and independent small dots) and a non-image area was prepared by exposing (post-exposure) the photosensitive layer for 10 minutes using the above exposure device from a distance of 15 cm.

(Image Reproducibility)

Whether or not the pattern formed on the infrared ablation layer was reproduced on the flexographic printing plate was confirmed with an optical microscope [VH8000 manufactured by Keyence Corporation, magnification: 100 times] and evaluated according to the following standards. The results are shown in Table 1 below.

A: Halftone dots and independent dots are reproduced.
B: Only halftone dots or independent dots are reproduced.
C: Neither halftone dots nor independent dots are reproduced.

The following components were used as the components shown in Table 1 above.

Polysulfonic acid sodium salt: sodium salt of β-naphthalenesulfonic acid formalin condensate [DEMOL NL, weight average molecular weight: 3000, manufactured by Kao Corporation]

Polycarboxylic acid sodium salt: POLYSTER (registered trademark) OMR [weight average molecular weight: 30000, manufactured by NOF Corporation]

Polycarboxylic acid: MALIALIM (registered trademark) SC-505K [weight average molecular weight: 20000, manufactured by NOF CORPORATION]

Sulfonic acid sodium salt: PELEX SS-L [Molecular weight: 350, manufactured by Kao Corporation]

Sodium carbonate: Reagent (manufactured by Wako Pure Chemical Industries, Ltd.)

Water: Tap water

As shown in Table 1 above, in a case where a surfactant having a molecular weight of less than 1000 was used, it was found that in a case where the dispersion contained in the aqueous developer in the assumption of repeated use was increased was diluted with water in the assumption of the rinsing step, the adhesion of the dispersion was increased (Comparative Examples 1 and 2). Particularly, similar to Example 1, in a case where 0.01% by mass of the surfactant was formulated, it was found that in a case where the surfactant was a surfactant having a molecular weight of less than 1000, the dispersion was aggregated (Comparative Example 3).

On the other hand, in a case where a surfactant having a molecular weight of 1000 or more was used, it was found that good printing reproducibility was maintained and even in a case where the dispersion contained in the aqueous developer in the assumption of repeated use was diluted with water in the assumption of the rinsing step, the adhesion and aggregating properties of the adhesion could be suppressed (Examples 1 to 19).

Particularly, from the comparison of Examples 1 to 4, it was found that in a case where the content of the surfactant

TABLE 1

| | | Example | | | | | | | | | Comparative Example | | |
|---|---|---|---|---|---|---|---|---|---|---|---|---|---|
| | | 1 | 2 | 3 | 4 | 5 | 6 | 7 | 8 | 9 | 1 | 2 | 3 |
| Surfactant | Polysulfonic acid sodium salt | 0.01 | 0.1 | 0.5 | 1.0 | | | 0.1 | | | | | |
| | Polycarboxylic acid sodium salt | | | | | 0.1 | | | 0.1 | | | | |
| | Polycarboxylic acid | | | | | | 0.1 | | | 0.1 | | | |
| | Sulfonic acid sodium salt | | | | | | | | | | 0.1 | 0.1 | 0.01 |
| Alkali metal carbonate | Sodium carbonate | | | | | | | 0.4 | 0.4 | 0.4 | | 0.4 | |
| Water | | 99.99 | 99.9 | 99.5 | 99.0 | 99.9 | 99.9 | 99.5 | 99.5 | 99.5 | 99.9 | 99.5 | 99.99 |
| Adhesion of dispersion | | B | A | A | A | B | B | A | A | A | D | D | D |
| Aggregating properties of dispersion | | A | A | B | C | B | C | A | A | B | B | A | D |
| Image Reproducibility | | A | A | A | A | A | A | A | A | A | A | A | A | was more than 0.01% by mass and less than 0.5% by mass, the adhesion and aggregation of the dispersion could be further suppressed.

Further, from the comparison between Examples 5 and 8 and the comparison between Examples 6 and 9, it was found that in a case where alkali metal carbonate was formulated, the adhesion of the dispersion could be further suppressed.

What is claimed is:

1. A method of manufacturing a flexographic printing plate having a non-image area and an image area, the method comprising:
   an exposure step of imagewise exposing a photosensitive layer in a flexographic printing plate precursor having the photosensitive layer;
   a development step of performing development using an aqueous developer for a flexographic printing plate after the exposure step to form a non-image area and an image area; the aqueous developer including: a surfactant having a molecular weight of 1000 or more; and water; and
   a rinsing step of rinsing the non-image area and the image area with water after the development step;
   wherein the surfactant is a polymer having a repeating unit represented by any one of Formulae (1) to (4) and (6), or a polymer represented by Formula (7),

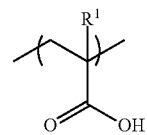
(1)

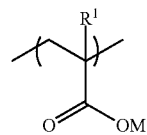
(2)

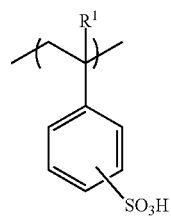
(3)

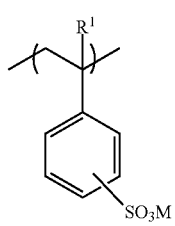
(4)

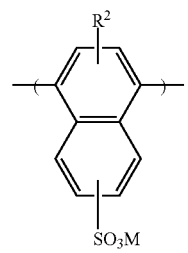
(6)

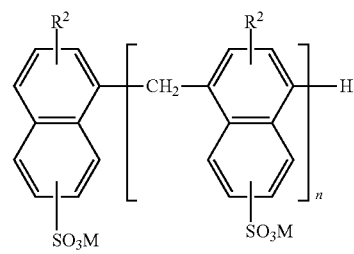
(7)

in Formulae (1) to (4), R1 represents a hydrogen atom or a methyl group, in Formulae (6), R2 represents any one of a hydrogen atom, a methyl group, or an ethyl group, and in Formulae (2), (4) and (6), M represents any one of sodium, potassium, or calcium, and in Formula (7), R2 represents any one of a hydrogen atom, a methyl group, or an ethyl group, M represents any one of sodium, potassium, or calcium, and n represents an integer of 1 or more.

2. The method of manufacturing a flexographic printing plate according to claim 1,
   wherein a content of the surfactant is 0.005% to 5% by mass.

3. The method of manufacturing a flexographic printing plate according to claim 1,
   wherein the surfactant is an anionic surfactant.

4. The method of manufacturing a flexographic printing plate according to claim 1,
   wherein the aqueous developer further includes at least one of an alkali metal carbonate or an alkali metal hydroxide.

5. The method of manufacturing a flexographic printing plate according to claim 2,
   wherein the surfactant is an anionic surfactant.

6. The method of manufacturing a flexographic printing plate according to claim 2,
   wherein the aqueous developer further includes at least one of an alkali metal carbonate or an alkali metal hydroxide.

7. The method of manufacturing a flexographic printing plate according to claim 3,
   wherein the aqueous developer further includes at least one of an alkali metal carbonate or an alkali metal hydroxide.

* * * * *